(12) United States Patent
Fischer et al.

(10) Patent No.: US 10,437,160 B2
(45) Date of Patent: Oct. 8, 2019

(54) LORENTZ ACTUATOR, OBJECT POSITIONING SYSTEM, LITHOGRAPHIC APPARATUS AND LORENTZ ACTUATOR OPERATING METHOD

(71) Applicant: ASML NETHERLANDS B.V., Veldhoven (NL)

(72) Inventors: Olof Martinus Josephus Fischer, Veldhoven (NL); Fidelus Adrianus Boon, Bavel (NL)

(73) Assignee: ASML Netherlands B.V., Veldhoven (NL)

( * ) Notice: Subject to any disclaimer, the term of this patent is extended or adjusted under 35 U.S.C. 154(b) by 4 days.

(21) Appl. No.: 15/749,226

(22) PCT Filed: Jul. 28, 2016

(86) PCT No.: PCT/EP2016/067975
§ 371 (c)(1),
(2) Date: Jan. 31, 2018

(87) PCT Pub. No.: WO2017/032540
PCT Pub. Date: Mar. 2, 2017

(65) Prior Publication Data
US 2018/0224756 A1  Aug. 9, 2018

(30) Foreign Application Priority Data
Aug. 27, 2015  (EP) .................... 15182657

(51) Int. Cl.
*G03B 27/58* (2006.01)
*G03F 7/20* (2006.01)
(Continued)

(52) U.S. Cl.
CPC ...... *G03F 7/70758* (2013.01); *G03F 7/70025* (2013.01); *G03F 7/70716* (2013.01);
(Continued)

(58) Field of Classification Search
CPC ............ G03F 7/70025; G03F 7/70716; G03F 7/70758; G03F 7/70775; H01F 7/064;
(Continued)

(56) References Cited

U.S. PATENT DOCUMENTS 6,713,904 B2  3/2004  Godkin
7,005,823 B2  2/2006  Houkes et al.
(Continued)

FOREIGN PATENT DOCUMENTS

EP  0 371 661  6/1990
EP  0 417 956  3/1991
(Continued)

OTHER PUBLICATIONS

Japanese Office action issued in corresponding Japanese Patent Application No. 2018-506257, dated Feb. 28, 2019.
(Continued)

*Primary Examiner* — Peter B Kim
(74) *Attorney, Agent, or Firm* — Pillsbury Winthrop Shaw Pittman LLP

(57) ABSTRACT

A Lorentz actuator includes: a magnet arrangement; a coil arrangement; and a current controller for supplying a current to the coil arrangement; wherein the magnet and coil arrangement are moveable relative to each other in a main direction, wherein the coil arrangement has a first and second coil portion that are separately operable by the current controller, such that when the same current is supplied to the first coil portion as is supplied to the second coil portion, Lorentz forces generated in the main direction by the first and second coil portions are also the same, and wherein the current controller is configured to supply a current to the first and second coil portions with a phase (Continued)

difference in order to compensate for parasitic reluctance and/or Lorentz forces in an auxiliary direction perpendicular to the main direction.

20 Claims, 3 Drawing Sheets

(51) Int. Cl.
*H02K 29/06* (2006.01)
*H02K 41/03* (2006.01)
*H02K 41/035* (2006.01)
*H01F 7/06* (2006.01)
*H01F 7/08* (2006.01)
*H01F 7/16* (2006.01)

(52) U.S. Cl.
CPC ......... *G03F 7/70775* (2013.01); *H01F 7/064* (2013.01); *H01F 7/081* (2013.01); *H01F 7/16* (2013.01); *H02K 29/06* (2013.01); *H02K 41/031* (2013.01); *H02K 41/0354* (2013.01)

(58) Field of Classification Search
CPC ........... H01F 7/081; H01F 7/16; H02K 26/06; H02K 41/031; H02K 41/0354
See application file for complete search history.

(56) References Cited

U.S. PATENT DOCUMENTS

| | | | |
|---|---|---|---|
| 7,656,062 B2 * | 2/2010 | Binnard | G03F 7/70758 310/12.05 |
| 2005/0140326 A1 | 6/2005 | Houkes et al. | |
| 2006/0049697 A1 | 3/2006 | Binnard | |
| 2006/0232142 A1 | 10/2006 | Binnard | |
| 2008/0067967 A1 | 3/2008 | Butler | |

FOREIGN PATENT DOCUMENTS

| | | |
|---|---|---|
| JP | 2004120885 | 4/2004 |
| JP | 2004515994 | 5/2004 |
| JP | 2005129941 | 5/2005 |
| JP | 2008141165 | 6/2008 |
| JP | 2010142048 | 6/2010 |
| WO | 2013172262 | 11/2013 |
| WO | 2014029678 | 2/2014 |
| WO | 2016/005568 | 1/2016 |

OTHER PUBLICATIONS

International Search Report and Written Opinion dated Dec. 5, 2016 in corresponding International Patent Application No. PCT/EP2016/067975.

* cited by examiner

LORENTZ ACTUATOR, OBJECT POSITIONING SYSTEM, LITHOGRAPHIC APPARATUS AND LORENTZ ACTUATOR OPERATING METHOD

CROSS-REFERENCE TO RELATED APPLICATIONS

This application is the U.S. national phase entry of PCT patent application No. PCT/EP2016/067975, which was filed on Jul. 28, 2016, which claims priority of European Patent application No. 15182657.5, which was filed on Aug. 27, 2015, and which is incorporated herein in its entirety by reference.

BACKGROUND

Field of the Invention

The present invention relates to a Lorentz actuator, an object positioning system comprising such a Lorentz actuator, a lithographic apparatus comprising such an object positioning system, and a method to operate such a Lorentz actuator.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus usually comprises one or more objects that need to be positioned accurately with respect to each other, for instance the patterning device, the substrate and/or the supports thereof. To position these objects in a main direction, use can be made of well-known Lorentz actuators. However, a drawback of Lorentz actuators is that due to tolerances in actuator components like magnets and positioning accuracy of coils with respect to the magnets, parasitic forces may occur in a direction perpendicular to the main direction.

Especially when the required accelerations are increased to improve throughput of the apparatus, the resulting currents increase as well, eventually causing the parasitic forces to have a significant impact on the dynamic performance of the apparatus.

SUMMARY

It is desirable to provide a Lorentz actuator in which the parasitic effects are addressed appropriately.

According to an embodiment of the invention, there is provided a Lorentz actuator comprising:
a magnet arrangement;
a coil arrangement;
a current controller for supplying a current to the coil arrangement;
wherein the magnet arrangement and coil arrangement are moveable relative to each other in a main direction,
wherein the coil arrangement comprises a first coil portion and a second coil portion that are separately operable by the current controller,
and wherein the current controller is configured to supply a first current to the first coil portion and a second current to the second coil portion and to apply a phase difference to the first current and/or the second current, in order to compensate for parasitic reluctance and/or Lorentz forces in an auxiliary direction perpendicular to the main direction.

According to another embodiment of the invention, there is provided a Lorentz actuator comprising:
a magnet arrangement;
a coil arrangement;
a current controller for supplying a current to the coil arrangement;
wherein the magnet arrangement and coil arrangement are moveable relative to each other in a main direction,
wherein the actuator comprises compensation coils to apply forces between the magnet arrangement and the coil arrangement in an auxiliary direction by supplying a current through the compensation coils,
and wherein the current controller is configured to supply a current through the compensation coils in order to compensate for parasitic reluctance and/or Lorentz forces in the auxiliary direction perpendicular to the main direction, e.g. the scanning direction.

According to a further embodiment of the invention, there is provided an object positioning system comprising:
a set-point generator for generating a set-point representative for the desired position of an object in a main direction;
a measurement system for outputting a measurement signal representative for the actual position of the object in the main direction;
a Lorentz actuator for applying forces to the object in the main direction according to the invention; and
a control unit, e.g. a positioning controller, for controlling the current controller, e.g. including a current amplifier, of the Lorentz actuator in dependency of a difference between set-point and measurement signal.

According to yet another embodiment of the invention, there is provided a lithographic apparatus comprising an object positioning system according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
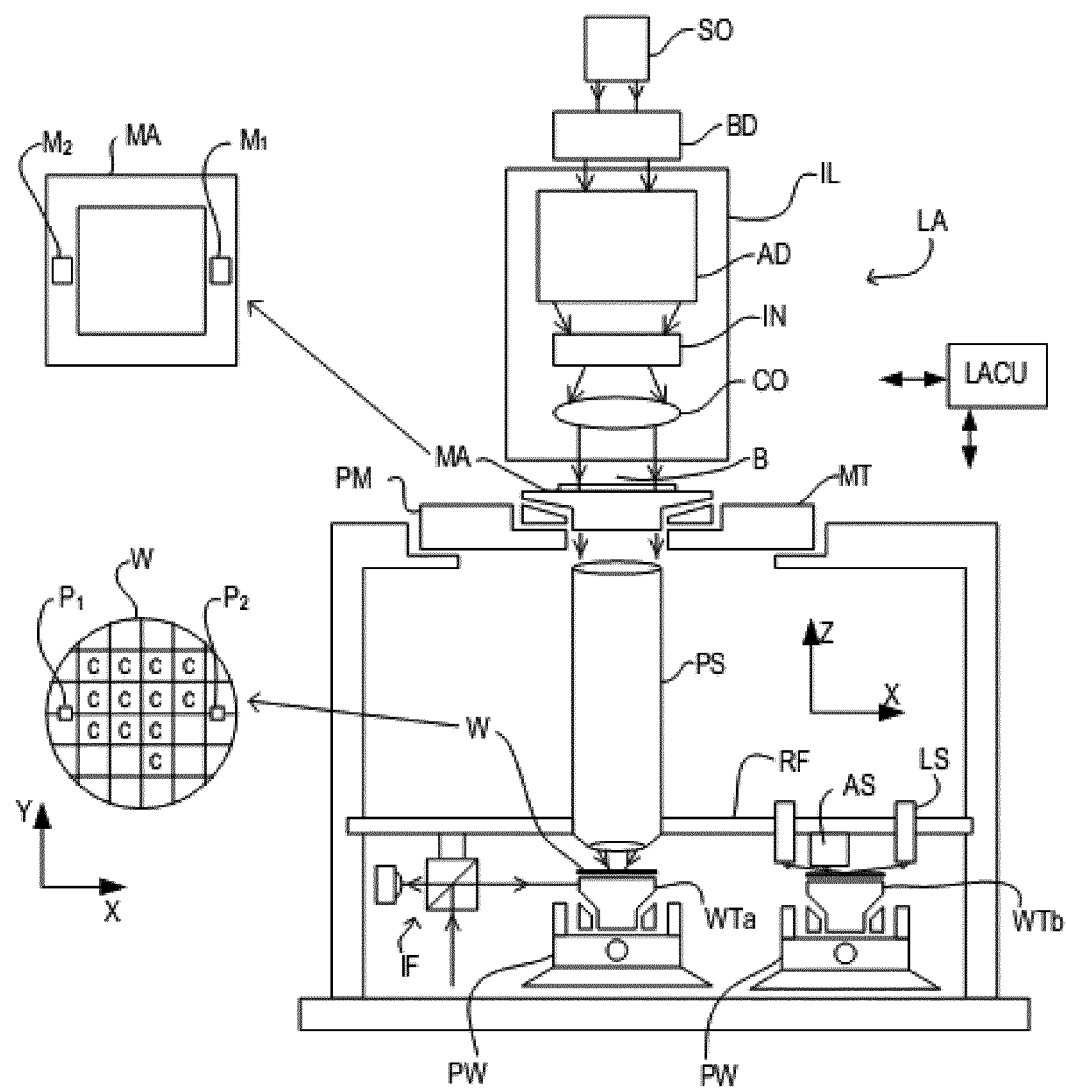
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, and/or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small minors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

As described above, the lithographic apparatus may comprise moveable objects that need to be positioned. Examples thereof are the support MT constructed to support the patterning device MA and the substrate tables WTa, WTb constructed to hold a substrate W. These objects are in the following embodiments positioned by object positioning systems making use of Lorentz actuators.

Figure 2A:
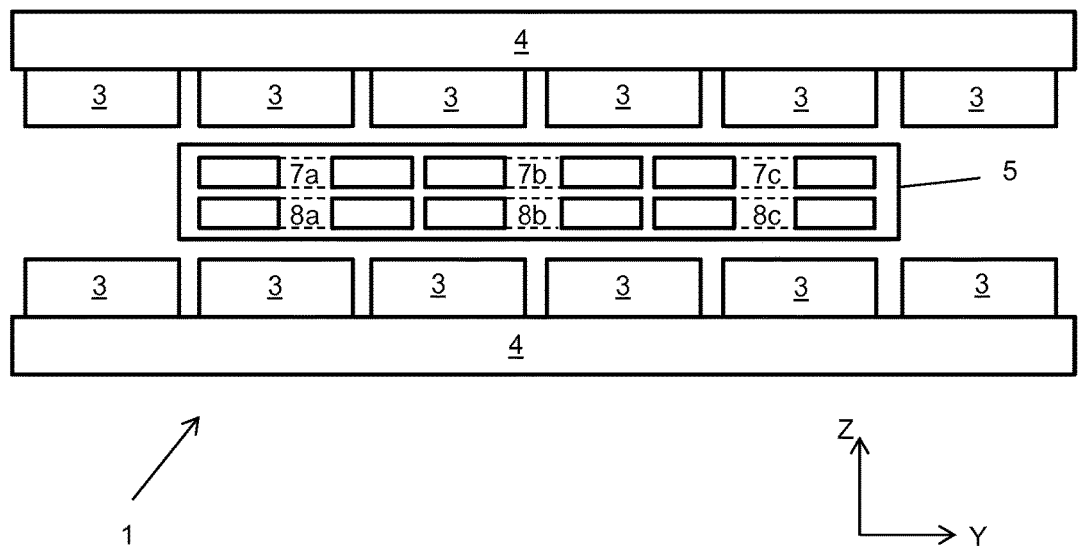
FIGS. 2a and 2b depict Lorentz actuators according to embodiments of the invention.

A Lorentz actuator 1 according to an embodiment of the invention is depicted in FIG. 2a. The shown actuator comprises a magnet arrangement of multiple permanent magnets 3 that are arranged in two parallel planes extending in an Y direction and an X direction (not shown) perpendicular to the Y direction and a Z direction. Each array of permanent magnets 3 forming one of the two parallel planes is supported by a respective back-iron plate 4. The back-iron plate 4 not only has the function of supporting the magnets 3, but also keeps the magnetic field generated by the magnets 3 within the actuator thereby improving efficiency of the actuator.

Arranged in between the two planes of permanent magnets 3 is a mover 5, which mover 5 is moveable relative to the magnet arrangement and carries a coil arrangement comprising multiple coils 7a, 7b, 7c, 8a, 8b, 8c in order to form a multiphase coil arrangement. Each coil 7a, 7b, 7c, 8a, 8b, 8c is arranged such that a current running through a respective coil is able to interact with the magnetic fields produced by the permanent magnets 3 in order to generate Lorentz forces in a main direction, here the Y direction. This allows to apply forces to the mover 5 and position the mover 5 in the main direction.

The coil arrangement comprises a first coil portion formed by coils 7a, 7b and 7c, and a second coil portion formed by coils 8a, 8b and 8c. In the embodiment as shown, the first coil portion and the second coil portion are arranged to generate substantially the same Lorentz forces in the main direction when substantially the same current is provided to the first coil portion and to the second coil portion; i.e. when the same current is supplied to the first coil portion as is supplied to the second coil portion, Lorentz forces generated in the main direction by the first coil portion and the second coil portion are also the same.

The coil arrangement in this embodiment is a three-phase coil arrangement, wherein coils 7a, 8a form a first phase, coils 7b, 8b form a second phase, and coils 7c, 8c form a third phase. Usually the current through the three phases is sinusoidal with a 120 degrees phase shift between the three phases. However, other configurations are also envisaged.

In practice, the inaccurate positioning of the coils in Z-direction with respect to the back-iron plates 4 results in parasitic reluctance forces/torques in Z-direction or X-direction, acting on the mover 5 during operation of the actuator 1. Further, the magnetic field in the actuator may also have a field component in Y-direction, resulting in parasitic Lorentz forces/torques in Z-direction or the X-direction, acting on the mover 5 during operation of the actuator 1.

The invention according to this embodiment is based on the insight that the coil arrangement being split into a first coil portion and a second coil portion can be used to compensate the parasitic reluctance and/or Lorentz forces in Z-direction by supplying a first current to the first coil portion and a second current to the second coil portion and to apply a phase difference to either the first current or the second current or both.

In an embodiment, the phase difference as applied is a phase difference between the first current and the second current. Alternatively, the applied phase difference may also be defined relative to a nominal phase angle of the current as applied in either the first coil portion or the second coil portion. The nominal phase angle of the current refers to the phase angle that would be applied to the current in order to generate a force directed in the main direction. In such embodiment, the phase difference, i.e. the difference in phase angle of the current as applied and the nominal phase angle may also be referred to as a phase shift. As will be clear to the skilled person, within the meaning of the present invention, such a phase shift is applied in order to generate a force both in the main direction and in the auxiliary direction. As such, by applying a phase shift in the current a 2D force (having a component in both the main direction and the auxiliary direction) can by generated by each coil portion. In an embodiment, the phase shift applied to the first current applied in the first coil portion may an opposite sign compared to the phase shift applied to the second current applied in the second coil portion (resulting in a phase difference between the first and second current equal to two times the phase shift), resulting in the generating of an offset force in the Z-direction. In an embodiment, the phase shifts as applied in the currents of the first and second coil portion may also be controlled separately/independently per phase to overcome and/or counteract Rx torques, i.e. torque components about the X-direction, e.g. in case of a Z-direction offset force/Rx-tilt combination acting on the coil arrangement relative to the magnet arrangement.

In an embodiment, the phase difference, or phase shift is preferably at most $\frac{1}{8}*\pi$ rad, more preferably at most $\frac{1}{16}*\pi$ rad, and most preferably at most $\frac{1}{32}*\pi$ rad. The Z direction may also be referred to as auxiliary direction as it is perpendicular to the Y-direction, also called the main direction, as this is the direction in which the mover is to be positioned by the actuator.

When the phase difference between the current in the first coil portion and the current in the second coil portion is zero, no compensation is applied. A situation where no compensation needs to be applied may e.g. occur when the parasitic forces acting in Z direction on the first coil portion and the second coil portion are equal but opposite in sign.

When a phase difference is applied between the current in the first coil portion and the current in the second coil portion, a deliberate difference is generated in the parasitic Lorentz forces acting upon the first and second coil portions, which allows to compensate for the non-deliberate occurring differences in parasitic Lorentz forces and for the occurring differences in parasitic reluctance forces acting upon the first and second coil portions.

In an embodiment, the phase difference is equal for all phases of the coil arrangement, but it is also envisaged that a separate respective phase difference is applied to each phase of the coil arrangement.

In an embodiment, the phase difference applied between the current in the first coil portion and the current in the second coil portion may be dependent on the position of the coil arrangement relative to the magnet arrangement in the main direction (Y-direction), which position may be determined by a suitable measurement system as will also be explained below.

Alternatively or additionally, the phase difference applied between the first and second coil portions may be dependent on the position of the coil arrangement relative to the magnet arrangement in the auxiliary direction (Z-direction), which position may be determined by a suitable measurement system.

Figure 2B:
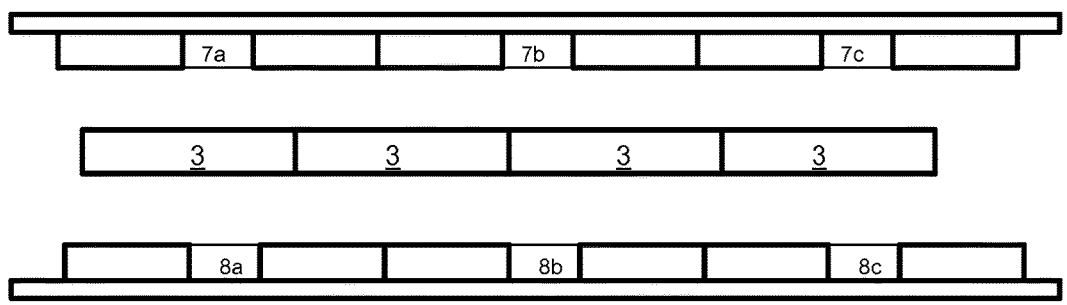

It will be apparent to the skilled person that although the embodiment of FIG. 2a is a moving coil configuration, the invention can also be applied to a moving magnet configuration as shown in FIG. 2b. The moving magnet configuration may for instance comprise a coil arrangement with multiple coils (a first coil portion formed by coils 7a, 7b and 7c, and a second coil portion formed by coils 8a, 8b and 8c) arranged in two parallel planes, wherein the magnet arrangement comprises multiple magnets 3 moveable in between the two parallel planes of coils to form a multiphase coil arrangement, wherein each phase comprises two coils (coils 7a, 8a form a first phase, coils 7b, 8b form a second phase, and coils 7c, 8c form a third phase), one coil being arranged in one of the two parallel planes and being part of the first coil portion, and the other coil being arranged in the other of the two parallel planes opposite the one coil and being part of the second coil portion.

Figure 3:
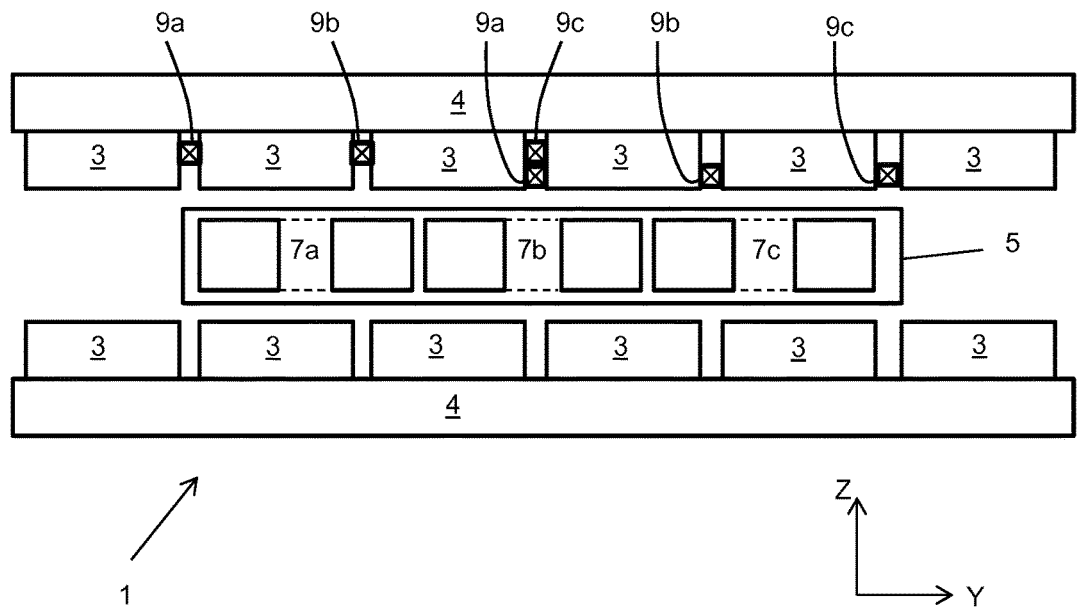
FIG. 3 depicts a Lorentz actuator according to another embodiment of the invention.

FIG. 3 depicts a Lorentz actuator 1 according to another embodiment of the invention. The actuator 1 of FIG. 3 has a similar configuration as the actuator 1 of FIG. 2a, in that it also comprises a magnet arrangement of multiple permanent magnets 3 that are arranged in two parallel planes extending in an Y direction and an X direction (not shown) perpendicular to the Y direction and a Z direction, wherein each array of permanent magnets 3 forming one of the two parallel planes is supported by a respective back-iron plate 4.

Arranged in between the two planes of permanent magnets 3 is a mover 5, which mover 5 is moveable relative to the magnet arrangement and carries a coil arrangement comprising multiple coils 7a, 7b, 7c in order to form a multiphase coil arrangement. Each coil 7a, 7b, 7c is arranged such that a current running through a respective coil is able to interact with the magnetic fields produced by the permanent magnets 3 in order to generate Lorentz forces in a main direction, here the Y direction. This allows to apply forces to the mover 5 and to position the mover 5 in the main direction.

Where in the invention according to FIG. 2a and FIG. 2b, the coils 7a, 7b, 7c are "split up" into a first coil portion and a second coil portion, the invention according to FIG. 3 uses compensation coils 9a, 9b, 9c to apply forces between the magnet arrangement and the coil arrangement in an auxiliary direction (Z-direction) perpendicular to the main direction (Y-direction) by supplying a current through the compensation coils 9a, 9b, 9c.

In this embodiment, there is a compensation coil for each phase of the coil arrangement, and the pattern of the compensation coils 9a, 9b, 9c can be continued to the left and/or right depending on the moving range of the mover 5. However, other configurations are also envisaged as long as the compensation coils are able to apply repelling and attracting forces to the coil arrangement in order to compensate for parasitic reluctance and/or Lorentz forces in the auxiliary direction (Z-direction).

It will be apparent for the skilled person that the invention according to FIG. 3 can also be implemented in a moving magnet configuration.

Figure 4:
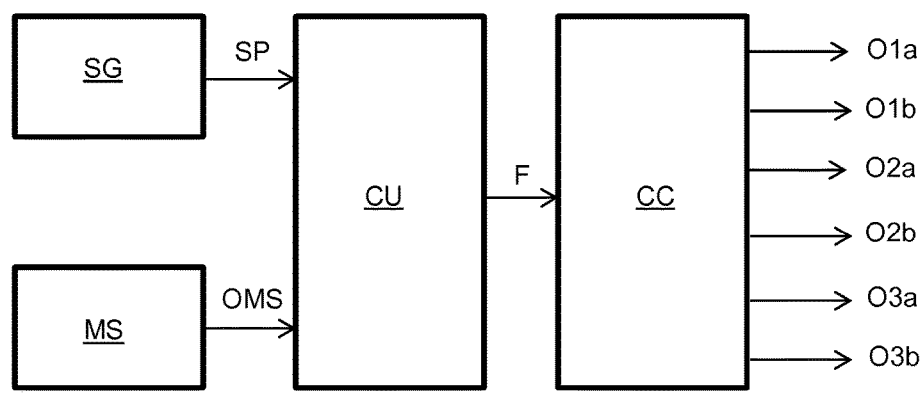
FIG. 4 schematically depicts an object positioning system according to an embodiment of the invention.

FIG. 4 depicts an object positioning system comprising a set-point generator SG for generating a set-point SP representative for the desired position of an object, e.g. a mover, in a main direction. The system further comprises a measurement system MS for outputting a measurement signal OMS representative for the actual position of the object in the main direction.

The set-point SP and the measurement signal OMS are provided to a control unit CU to determine a difference between set-point SP and measurement signal OMS and to output a control signal F to a current controller CC part of a Lorentz actuator according to FIG. 2a, FIG. 2b or FIG. 3. The control signal F may for instance be a required force to be applied by the Lorentz actuator in the main direction. The control signal may also comprise information about the position of the mover of the Lorentz actuator for commutation purposes.

The current controller CC outputs six current signals O1a, O1b, O2a, O2b, O3a and O3b.

In case of controlling a Lorentz actuator according to FIG. 2a or FIG. 2b, current signals O1a, O1b may be associated with the first phase formed by coils 7a, 8a, current signals O2a, O2b may be associated with the second phase formed by coils 7b, 8b, and current signals O3a, O3b may be associated with the third phase formed by coils 7c, 8c. The current controller CC is then configured to a first current to the first coil portion and a second current to the second coil portion and to apply a phase difference of at most ⅛*π rad between the first current and the second current, in order to compensate for parasitic reluctance and/or Lorentz forces in an auxiliary direction perpendicular to the main direction. The phase difference may be determined based on the measurement signal OMS.

In case of controlling a Lorentz actuator according to FIG. 3, current signals O1a, O1b may be associated with the first phase formed by coil 7a and the compensation coil 9a, current signals O2a, O2b may be associated with the second phase formed by coil 7b and the compensation coil 9b, and current signals O3a, O3b may be associated with the third phase formed by coil 7c and the compensation coil 9c. The current controller CC is then configured to supply a current through the compensation coils in order to compensate for parasitic reluctance and/or Lorentz forces in the auxiliary direction. The current signals are in that case all commutated depending on the measurement signal OMS.

In an embodiment, there is provided a Lorentz actuator comprising: a magnet arrangement; a coil arrangement; and a current controller for supplying a current to the coil arrangement; wherein the magnet arrangement and coil arrangement are moveable relative to each other in a main direction, wherein the coil arrangement comprises a first coil portion and a second coil portion that are separately operable by the current controller, and wherein the current controller is configured to supply a first current to the first coil portion and a second current to the second coil portion and to apply a phase difference to the first current and/or the second current, in order to compensate for parasitic reluctance and/or Lorentz forces in an auxiliary direction perpendicular to the main direction.

In an embodiment, wherein the first coil portion and the second coil portion are configured to generate substantially the same Lorentz forces in the main direction when substantially the same current is provided to the first coil portion and to the second coil portion. In an embodiment, the magnet arrangement is stationary and the coil arrangement is moveable relative to the magnet arrangement. In an embodiment, the coil arrangement is stationary and the magnet arrangement is moveable relative to the coil arrangement. In an embodiment, the current controller is configured to determine the phase difference between the first current and the second current supplied to the first and second coil portion based on a measured position of the coil arrangement relative to the magnet arrangement in the main direction. In an embodiment, the current controller is configured to base the to be applied phase difference between the currents supplied to the first and second coil portion on a measured position of the coil arrangement relative to the magnet arrangement in the auxiliary direction. In an embodiment, the magnet arrangement comprises multiple permanent magnets arranged in two parallel planes, wherein the coil arrangement comprises multiple coils moveable in between the two parallel planes of permanent magnets to form a multiphase coil arrangement, wherein each phase comprises two coils arranged next to each other in the auxiliary direction which is perpendicular to the two parallel planes, one coil being part of the first coil portion and the other coil being part of the second coil portion. In an embodiment, the coil arrangement comprises multiple coils arranged in two parallel planes, wherein the magnet arrangement comprises multiple magnets moveable in between the two parallel planes of coils to form a multiphase coil arrangement, wherein each phase comprises two coils, one coil being arranged in one of the two parallel planes and being part of the first coil portion, and the other coil being arranged in the other of the two parallel planes opposite the one coil and being part of the second coil portion.

In an embodiment, there is provided a Lorentz actuator comprising: a magnet arrangement; a coil arrangement; and a current controller for supplying a current to the coil arrangement; wherein the magnet arrangement and coil arrangement are moveable relative to each other in a main direction, wherein the actuator comprises compensation coils to apply forces between the magnet arrangement and the coil arrangement in an auxiliary direction perpendicular to the main direction by supplying a current through the compensation coils, and wherein the current controller is configured to supply a current through the compensation coils in order to compensate for parasitic reluctance and/or Lorentz forces in the auxiliary direction.

In an embodiment, the magnet arrangement is stationary and the coil arrangement is moveable relative to the magnet arrangement, and wherein the compensation coils are arranged at or near the magnet arrangement. In an embodiment, the magnet arrangement comprises multiple permanent magnets arranged in two parallel planes, wherein the coil arrangement comprises multiple coils moveable in between the two parallel planes of permanent magnets to form a multiphase coil arrangement, and wherein the compensation coils are arranged in one of the two parallel planes of permanent magnets.

In an embodiment, there is provided an object positioning system comprising: a set-point generator for generating a set-point representative for the desired position of an object in a main direction; a measurement system for outputting a measurement signal representative for the actual position of the object in the main direction; a Lorentz actuator for applying forces to the object in the main direction as described herein; and a control unit for controlling the current controller of the Lorentz actuator in dependency of a difference between set-point and measurement signal.

In an embodiment, there is provided a lithographic apparatus comprising an object positioning system as described herein. In an embodiment, the lithographic apparatus further comprises: an illumination system configured to condition a radiation beam; a support constructed to support a patterning device, the patterning device being cable of imparting the radiation beam with a pattern in its cross-section to form a patterned radiation beam; a substrate table constructed to hold a substrate; and a projection system configured to project the patterned radiation beam onto a target portion of the substrate, wherein the object positioning system is configured to position the support or the substrate table.

In an embodiment, there is provided a method for operating a Lorentz actuator comprising a magnet arrangement and a coil arrangement, wherein the coil and magnet arrangements are moveable relative to each other in a main direction, and wherein the coil arrangement comprises a first coil portion and a second coil portion, the method comprising: supplying a first current to the first coil portion and a second current to the second coil portion; and applying a phase difference to the first current and/or the second current, in order to compensate for parasitic reluctance and/or Lorentz forces in an auxiliary direction perpendicular to the main direction.

In an embodiment, there is provided a method for operating a Lorentz actuator comprising a magnet arrangement and a coil arrangement, wherein the coil and magnet arrangements are moveable relative to each other in a main direction, and wherein the actuator comprises compensation coils to apply forces between the magnet arrangement and the coil arrangement, the method comprising supplying a current through the compensation coils in order to compensate for parasitic reluctance and/or Lorentz forces in an auxiliary direction perpendicular to the main direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A Lorentz actuator comprising:
a magnet arrangement;
a coil arrangement; and
a current controller configured to supply a current to the coil arrangement;
wherein the magnet arrangement or coil arrangement is moveable relative to the other in a main direction,
wherein the coil arrangement comprises a first coil portion and a second coil portion that are separately operable by the current controller, and
wherein the current controller is configured to supply a first current to the first coil portion and a second current to the second coil portion and to apply a phase difference to the first current and/or the second current, in order to compensate for parasitic reluctance and/or Lorentz forces in an auxiliary direction perpendicular to the main direction.

2. The Lorentz actuator according to claim 1, wherein the first coil portion and the second coil portion are configured to generate substantially the same Lorentz forces in the main direction when substantially the same current is provided to the first coil portion and to the second coil portion.

3. The Lorentz actuator according to claim 1, wherein the magnet arrangement is stationary and the coil arrangement is moveable relative to the magnet arrangement.

4. The Lorentz actuator according to claim 3, wherein the magnet arrangement comprises multiple permanent magnets arranged in two parallel planes, wherein the coil arrangement comprises multiple coils moveable in between the two parallel planes of permanent magnets to form a multiphase coil arrangement, wherein each phase comprises two coils arranged next to each other in the auxiliary direction which is perpendicular to the two parallel planes, a first coil of the two coils being part of the first coil portion and a second coil of the two coils being part of the second coil portion.

5. The Lorentz actuator according to claim 1, wherein the coil arrangement is stationary and the magnet arrangement is moveable relative to the coil arrangement.

6. The Lorentz actuator according to claim 5, wherein the coil arrangement comprises multiple coils arranged in two parallel planes, wherein the magnet arrangement comprises multiple magnets moveable in between the two parallel planes of coils to form a multiphase coil arrangement, wherein each phase comprises two coils, a first coil of the two coils being arranged in one of the two parallel planes and being part of the first coil portion, and a second coil of the two coils being arranged in the other of the two parallel planes opposite the first coil and being part of the second coil portion.

7. The Lorentz actuator according to claim 1, wherein the current controller is configured to base the to be applied phase difference between the currents supplied to the first and second coil portions on a measured position of the coil arrangement relative to the magnet arrangement in the auxiliary direction.

8. An object positioning system comprising:
a set-point generator configured to generate a set-point representative for a desired position of an object in a main direction;
a measurement system configured to output a measurement signal representative for an actual position of the object in the main direction;
the Lorentz actuator according to claim 1 configured to apply forces to the object in the main direction; and
a control unit configured to control the current controller of the Lorentz actuator in dependency of a difference between the set-point and the measurement signal.

9. A lithographic apparatus comprising the object positioning system according to claim 8.

10. A lithographic apparatus according to claim 9, further comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate,
wherein the object positioning system is configured to position the support or the substrate table.

11. A Lorentz actuator comprising:
a magnet arrangement;
a coil arrangement; and
a current controller configured to supply a current to the coil arrangement;
wherein the magnet arrangement or coil arrangement is moveable relative to the other in a main direction,
wherein the actuator comprises compensation coils to apply forces between the magnet arrangement and the coil arrangement in an auxiliary direction perpendicular to the main direction by supplying a current through the compensation coils, and
wherein the current controller is configured to supply a current through the compensation coils in order to compensate for parasitic reluctance and/or Lorentz forces in the auxiliary direction.

12. The Lorentz actuator according to claim 11, wherein the magnet arrangement is stationary and the coil arrangement is moveable relative to the magnet arrangement, and wherein the compensation coils are arranged at or near the magnet arrangement.

13. The Lorentz actuator according to claim 12, wherein the magnet arrangement comprises multiple permanent magnets arranged in two parallel planes, wherein the coil arrangement comprises multiple coils moveable in between the two parallel planes of permanent magnets to form a multiphase coil arrangement, and wherein the compensation coils are arranged in one of the two parallel planes of permanent magnets.

14. An object positioning system comprising:
a set-point generator configured to generate a set-point representative for a desired position of an object in a main direction;
a measurement system configured to output a measurement signal representative for an actual position of the object in the main direction;
the Lorentz actuator according to claim 11 configured to apply forces to the object in the main direction; and
a control unit configured to control the current controller of the Lorentz actuator in dependency of a difference between the set-point and the measurement signal.

15. A lithographic apparatus comprising the object positioning system according to claim 14.

16. A method for operating a Lorentz actuator comprising a magnet arrangement and a coil arrangement, wherein the coil arrangement or the magnet arrangement is moveable relative to the other in a main direction, and wherein the coil arrangement comprises a first coil portion and a second coil portion, the method comprising:
supplying a first current to the first coil portion and a second current to the second coil portion; and
applying a phase difference to the first current and/or the second current, in order to compensate for parasitic reluctance and/or Lorentz forces in an auxiliary direction perpendicular to the main direction.

17. The method according to claim 16, further comprising basing the to be applied phase difference between the currents supplied to the first and second coil portions on a measured position of the coil arrangement relative to the magnet arrangement in the auxiliary direction.

18. The method according to claim 16, wherein the magnet arrangement comprises multiple permanent magnets arranged in two parallel planes, wherein the coil arrangement comprises multiple coils moveable in between the two parallel planes of permanent magnets to form a multiphase coil arrangement, wherein each phase comprises two coils arranged next to each other in the auxiliary direction which is perpendicular to the two parallel planes, a first coil of the two coils being part of the first coil portion and a second coil of the two coils being part of the second coil portion.

19. The method according to claim 16, wherein the coil arrangement comprises multiple coils arranged in two parallel planes, wherein the magnet arrangement comprises multiple magnets moveable in between the two parallel planes of coils to form a multiphase coil arrangement, wherein each phase comprises two coils, a first coil of the two coils being arranged in one of the two parallel planes and being part of the first coil portion, and a second coil of the two coils being arranged in the other of the two parallel planes opposite the first coil and being part of the second coil portion.

20. A method for operating a Lorentz actuator comprising a magnet arrangement and a coil arrangement, wherein the coil arrangement or the magnet arrangement is moveable relative to the other in a main direction, and wherein the actuator comprises compensation coils to apply forces between the magnet arrangement and the coil arrangement, the method comprising supplying a current through the compensation coils in order to compensate for parasitic reluctance and/or Lorentz forces in an auxiliary direction perpendicular to the main direction.

* * * * *